(12) United States Patent
Jeong et al.

(10) Patent No.: US 6,861,737 B1
(45) Date of Patent: Mar. 1, 2005

(54) SEMICONDUCTOR DEVICE PACKAGES HAVING SEMICONDUCTOR CHIPS ATTACHED TO CIRCUIT BOARDS, AND STACK PACKAGES USING THE SAME

(75) Inventors: Moon Chea Jeong, Seoul (KR); Young Dae Kim, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 08/924,256

(22) Filed: Sep. 5, 1997

(30) Foreign Application Priority Data

Dec. 30, 1996 (KR) ............................................ 96-77197
Jul. 11, 1997 (KR) ............................................ 97-32281

(51) Int. Cl.[7] ........................ H01L 23/12; H01L 23/48; H01L 23/34
(52) U.S. Cl. ........................ 257/680; 257/666; 257/774; 257/693; 257/6.98; 257/686; 257/723; 257/758; 257/700; 257/678
(58) Field of Search ................................ 257/690, 680, 257/679, 777, 778, 723, 730, 686, 698, 673, 692, 693, 685, 700, 701, 758, 774, 668

(56) References Cited

U.S. PATENT DOCUMENTS 4,278,991 A * 7/1981 Ritchie et al. .............. 257/696
4,460,825 A * 7/1984 Haghiri-Tehrani et al. .. 257/679

(List continued on next page.)

FOREIGN PATENT DOCUMENTS

| JP | 2-89348 | * | 3/1990 | ................. 257/730 |
| JP | 3-295265 | * | 12/1991 | ................. 257/723 |
| JP | 4-134854 | * | 5/1992 | ................. 257/723 |
| JP | 4267361 A | * | 9/1992 | |
| JP | 9008171 A | * | 1/1997 | |

OTHER PUBLICATIONS

Patent Abstract of Japan, JP59009947 A, Jan. 19, 1984.*

Primary Examiner—Alexander Oscar Williams
(74) Attorney, Agent, or Firm—Jones Volentine, L.L.C.

(57) ABSTRACT

A semiconductor package device has a circuit board with upper and lower conductive metal patterns respectively formed on upper and lower surfaces of the circuit board, a cavity centrally formed in the lower surface, and an opening through the upper surface that is connected to the cavity. A semiconductor chip is attached to the lower surface of the circuit board by an adhesive so that bonding pads of the chip are exposed through the opening. The semiconductor chip is disposed entirely within the cavity of the circuit board. Plating layers formed on side surfaces of the circuit board are electrically interconnected to the upper and lower metal patterns. An encapsulant protects the electrical interconnection parts of the semiconductor device package. When used in a stack package, electrical connection between an upper semiconductor device package and a lower semiconductor device package of the stack package is accomplished by bonding the lower metal pattern of the upper semiconductor device package and the upper metal pattern of the lower semiconductor device package with a conductive adhesive. A lowermost semiconductor device package of the stack package is electrically connected to an external apparatus via the lower metal pattern of the lowermost semiconductor package.

5 Claims, 12 Drawing Sheets

U.S. PATENT DOCUMENTS

| | | | | |
|---|---|---|---|---|
| 4,996,587 A | * | 2/1991 | Hinrichsmeyer et al. | 257/676 |
| 5,048,179 A | * | 9/1991 | Shindo et al. | 257/679 |
| 5,223,741 A | * | 6/1993 | Bechtel | 257/678 |
| 5,280,192 A | * | 1/1994 | Kryzaniwsky | 257/723 |
| 5,331,203 A | * | 7/1994 | Wojnerowski et al. | 257/730 |
| 5,357,056 A | * | 10/1994 | Nagano | 257/680 |
| 5,384,689 A | * | 1/1995 | Shen | 257/686 |
| 5,689,091 A | * | 11/1997 | Hamzehdoost et al. | 174/255 |
| 5,723,900 A | * | 3/1998 | Kojima et al. | 257/666 |
| 5,723,901 A | * | 3/1998 | Katsumata | 257/686 |
| 5,723,907 A | * | 3/1998 | Akram | 257/679 |
| 5,736,780 A | * | 4/1998 | Murayama | 257/673 |
| 5,736,981 A | * | 4/1998 | Atsumi | 257/693 |
| 5,739,585 A | * | 4/1998 | Akram et al. | 257/698 |
| 5,801,439 A | * | 9/1998 | Fujisawa et al. | 257/692 |
| 5,811,879 A | * | 9/1998 | Akram | 257/698 |
| 5,835,988 A | * | 11/1998 | Ishii | 257/696 |
| 5,895,970 A | * | 4/1999 | Miyoshi | 257/696 |
| 5,939,782 A | * | 8/1999 | Malladi | 257/698 |

* cited by examiner

SEMICONDUCTOR DEVICE PACKAGES HAVING SEMICONDUCTOR CHIPS ATTACHED TO CIRCUIT BOARDS, AND STACK PACKAGES USING THE SAME

BACKGROUND OF THE INVENTION

1. Field of the Invention

The present invention generally relates to semiconductor device packages, and more particularly, to thin semiconductor device packages comprising a circuit board, manufacturing methods thereof, and stack packages employing the same.

2. Description of the Related Art

Semiconductor device packages need to be faster, smaller, and thinner in order to meet the increasing demands of miniaturization and multi-function capability for use in electronic apparatus. Ball Grid Array packages (hereinafter referred to as "BGA package") have been developed in an attempt to satisfy this trend. A BGA package is a type of surface mount package that uses a circuit board and solder balls or solder bumps, instead of lead frames, for electrical connection to the external apparatus. With the BGA package, the mounting density is improved and thus, the number of the input/output (I/O) pins increase.

FIG. 1 is a cross-sectional view depicting a conventional BGA package, more particularly a PBGA (Plastic Ball Grid Array) package manufactured by Hitachi. The package 20 includes a semiconductor chip 21, having an upper active surface 21a where the ICs are formed. The rear surface 21b of the chip 21 is attached to an upper surface 22a of a circuit board 22 having land patterns 23. The semiconductor chip 21 is electrically interconnected to the land patterns 23 using a wire-bonding method with Au (gold) wires 24, and the land patterns 23 are connected to bumps 25 which are formed on a lower surface 22b of the circuit board 22 for electrically connecting to the external apparatus. The electrical interconnections to the semiconductor chip are encapsulated with a molding compound 26 in order to protect them from external environmental stress.

Because the BGA package 20 utilizes bumps 25 as the external connection means throughout the lower surface of the circuit board 22, it has an advantage in that a semiconductor chip having an increased number of the I/O pins can be easily packaged. The pitch between the external connection means of the BGA package is usually in a range from 1.27 mm to 1.50 mm. However, micro-BGA packages or chip-scale packages (CSPs) having a pitch of 1.0 mm or less have been developed.

Although the BGA package is very effective for manufacturing smaller sized products having multiple pins, when the external connection means such as the solder balls or solder bumps are attached to the package, problems such as imprecise attachment, or defects in the solder balls or the solder bumps themselves can occur. Rework is cumbersome and test inspections with the naked eye are difficult. Further, the costs for forming the external connection means and manufacturing the circuit board are more expensive compared to other packages. For example, although a BGA package can be advantageously employed for packages having 200 or more pins, it is disadvantageous for memory chips or other types of micro chips having 100 or fewer pins.

SUMMARY OF THE INVENTION

Accordingly, the present invention provides a semiconductor device package which can be advantageously used for smaller and thinner electronic apparatuses. This increases the operational speed of the semiconductor chip due to the short distance between the semiconductor chip and the metal patterns at the lower surface of the circuit board which is used as an external connection means.

The present invention also provides a manufacturing method for the semiconductor device package which eliminates the step of attaching a separate external connection means, because the metal patterns of the circuit board are used as the external connection means. The semiconductor device packages of the present invention may also be incorporated into a stack package.

To achieve these and other advantages, the present invention provides a semiconductor device package, comprising: a circuit board having upper and lower conductive metal patterns respectively formed on upper and lower surfaces of the circuit board, a cavity centrally formed in the lower surface, and an opening through the upper surface that is connected to the cavity. A semiconductor chip is attached to the lower surface of the circuit board by an adhesive so that bonding pads of the chip are exposed through the opening. Plating layers formed on side surfaces of the circuit board are electrically interconnected to the upper and lower metal patterns. An encapsulant protects the electrical interconnection parts of the semiconductor device package.

When used in a stack package, electrical connection between an upper semiconductor device package and a lower semiconductor device package of the stack package is accomplished by bonding the lower metal pattern of the upper semiconductor device package and the upper metal pattern of the lower semiconductor device package with a conductive adhesive. A lowermost semiconductor device package of the stack package is electrically connected to an external apparatus via the lower metal pattern of the lowermost semiconductor package.

In another aspect, the present invention provides a method of manufacturing a semiconductor device package comprising steps of: (a) preparing a circuit board having upper and lower conductive metal patterns respectively formed on upper and lower surfaces of the circuit board; (b) forming a cavity in the lower surface and forming an opening through the upper surface of the circuit board for connecting to the cavity; (c) forming plating layers on inner walls of through holes arranged along sides surfaces of the circuit board for electrical connection to the upper and lower conductive metal patterns; (d) attaching a semiconductor chip to the lower surface of the circuit board within the cavity so that bonding pads of the chip are exposed through SW the opening; (e) interconnecting the metal patterns to the bonding pads with conductive wires; and (f) encapsulating electrical interconnection parts of the package with an epoxy molding compound (EMC).

Other embodiments of the invention incorporate a second circuit board with a conductive metal pattern formed between the first and second circuit boards for electrical connection to the plating layers. When used in a stack package, electrical connection between an upper semiconductor device package and a lower semiconductor device package is accomplished by bonding the plating layer of the lower surface of the first circuit board of the upper semiconductor device package and the plating layer of the upper surface of the second circuit board of the lower semiconductor device package with a conductive adhesive. The lowermost semiconductor device package of the plurality of semiconductor packages is electrically connected to an external apparatus via the plating layer of the lower surface of the first circuit board of the lowermost semiconductor package.

BRIEF DESCRIPTION OF THE DRAWINGS

These and various other features and advantages of the present invention will be described with reference to the accompanying drawings, wherein like reference numerals designate like structural elements, and, in which.

DETAILED DESCRIPTION OF THE PREFERRED EMBODIMENTS

Figure 1:
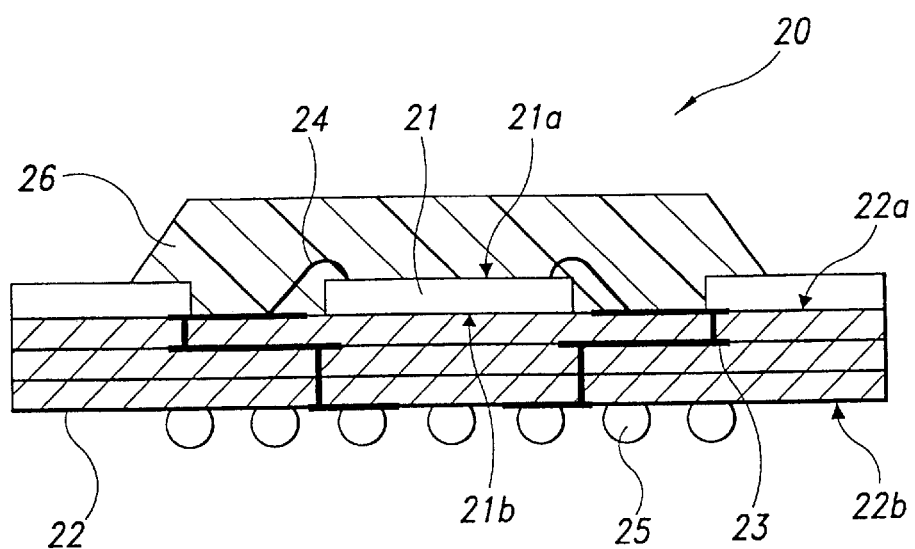
FIG. 1 is a cross-sectional view depicting a conventional BGA package.
Figure 2:
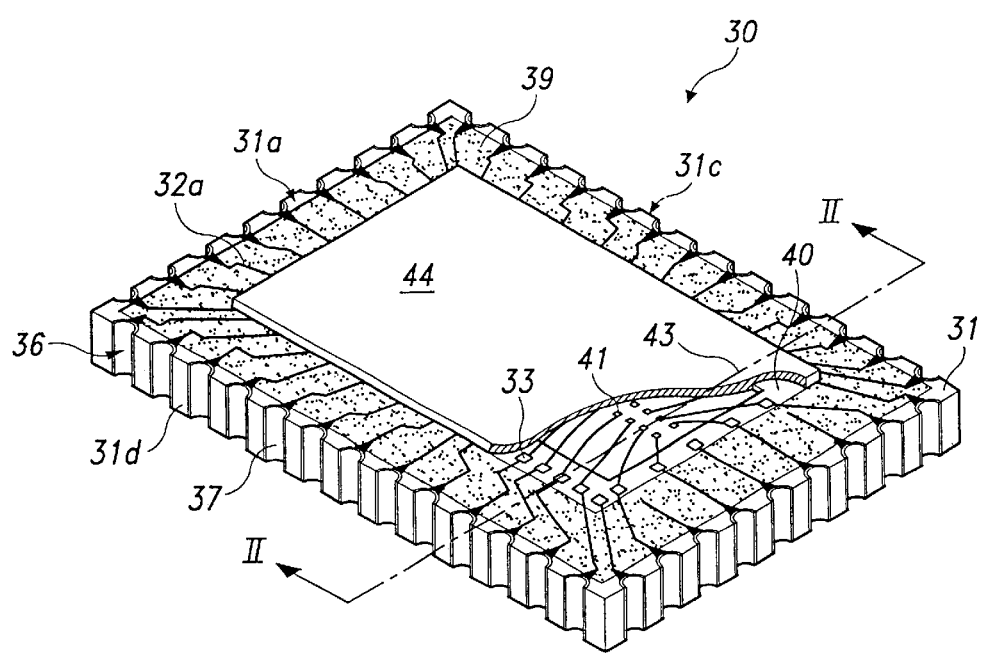
FIG. 2 is a cut-away perspective view depicting a semiconductor device package according to a first embodiment of the present invention.

Preferred embodiments of the present invention will be described below with reference to the accompanying drawings. FIG. 2 is a cut-away perspective view depicting a semiconductor device package according to the first embodiment of the present invention, and FIG. 3 is a cross-sectional view taken along the line II—II in FIG. 2.

Figure 3:
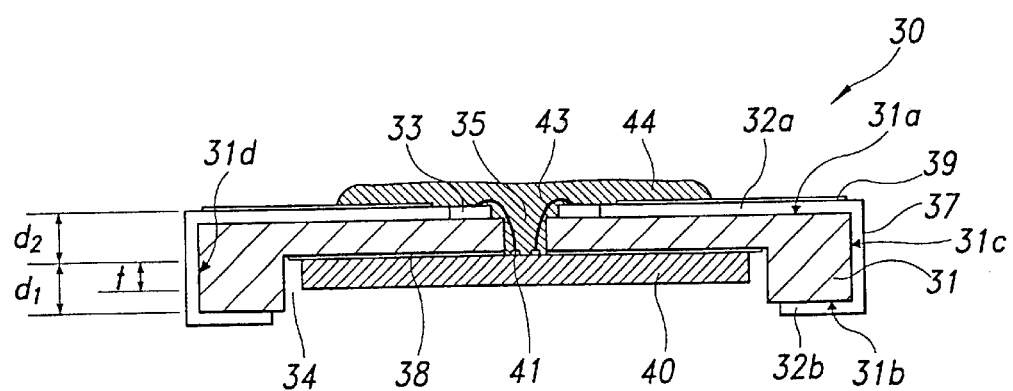
FIG. 3 is a cross-sectional view taken along the line II—II in FIG. 2.

As shown in FIGS. 2 and 3, a semiconductor package 30 of the present invention uses metal patterns 32 as an external connection means, rather than solder balls or solder bumps as used in conventional BGA packages. The metal patterns 32a, which are formed on an upper surface 31a of the circuit board 31, are electrically interconnected to the semiconductor chip 40 by a wire-bonding method using wires 43. The metal patterns 32b, which are formed on a lower surface 31b of the circuit board 31 are used as an external connection means. The metal patterns 32a, 32b are electrically connected to each other by plating layers 37. The plating layers 37 comprise a conductive metal formed on inner walls of through holes 36. As shown best in FIG. 2, the through holes 36 are formed on the side surfaces 31c and 31d of the circuit board 31.

Semiconductor chips are generally classified as either a center bonding pad type or edge bonding pad type, depending on the location of the bonding pads 41 disposed on the active surface of the chip. In the edge bonding pad type the bonding pads 41 are disposed on the opposing edges of the active surface of the chip, while in the center bonding pad type the bonding pads 41 are disposed at the center of the active surface of the chip, either in a single row or a plurality of the adjacent rows. Although the package 30 shown in FIG. 2 and FIG. 3 uses the center bonding pad type semiconductor chip 40 to reduce the size of the package, the present invention can be employed for both pad types.

The metal patterns 32a are protected from external environmental stress by passivation layers 39 comprising photosensitive solder resist (PSR). Connection pads 33 extending from the metal patterns 32a provide higher-quality and more stable bonding connections for the wires 43.

A cavity 34 having a constant width and depth is formed in the lower surface 31b of the circuit board 31, and an opening 35 passes through the center of the circuit board 31 and connects with the cavity 34. The semiconductor chip 40 is attached to the circuit board 31 with nonconductive adhesive 38 and positioned so that the centrally-disposed bonding pads 41 of the chip 40 are exposed through the opening 35 when the semiconductor chip 40 is disposed in the cavity 34. The depth '$d_1$' of the cavity 34 is greater than the thickness 't' of the semiconductor chip 40 so as to reduce the thickness of the package 30. The bonding pads 41 are electrically interconnected to the connection pads 33 of the metal patterns 32a by conductive metal wires 43, such as Au wires.

The thickness 'T' of the circuit board 31 and the depth '$d_1$' of the cavity should be defined during the circuit board design step, because the depth '$d_2$' from the bonding pads 41 of the semiconductor chip 40 to the metal patterns 32a is closely related to the optimum wire loop.

The electrical interconnections between the semiconductor chip 40 and the circuit board 31 are encapsulated with an epoxy molding compound (EMC) 44 for protecting them from the external environment. A transfer molding method or the potting method can be employed. The lower surface 31b of the semiconductor chip 40 can be exposed from the EMC 44 in order to dissipate the heat from the chip 40. In the cavity 34, any spaces between the semiconductor chip 40 and the circuit board 31 can be filled with the EMC 44 for protecting the semiconductor chip 40.

When the semiconductor device package 30 is mounted on the external apparatus, a visual test and inspection can be easily performed. Also, since the distance from the semiconductor chip 40 to the metal patterns 32b of the lower surface 31b of the circuit board 31 is kept shorter, the transmission speed of the electrical signal of the chip can be increased, and the inductance of the signal path can be reduced.

The semiconductor device package 30 of the present invention has several advantages. First, since the semiconductor chip 40 is placed in the cavity 34 of the circuit board 31 and the metal patterns 32b of the circuit board 31 are used as the external connection means, outer leads of conventional semiconductor device packages or solder balls of the BGA package can be eliminated, such that the size and the thickness of the package can be reduced.

Moreover, this structure can be manufactured as a chip-sized package (CSP), or one that is slightly larger than the chip, or one where the chip size is 80% or more of the package. Such a CSP can solve the problems of testing and handling, while still providing thinner products than produced through the flip chip technique. In addition, because the semiconductor device package of the present invention uses the metal patterns of the circuit board as the external connection means, the step of attaching separate external connection terminals to the circuit board is eliminated.

A manufacturing method of the above-described semiconductor device package 30 is described as follows. FIG. 4A through FIG. 4F are cross-sectional views illustrating the manufacturing steps of the semiconductor device package 30 according to the first embodiment of the present invention.

Figure 4A:
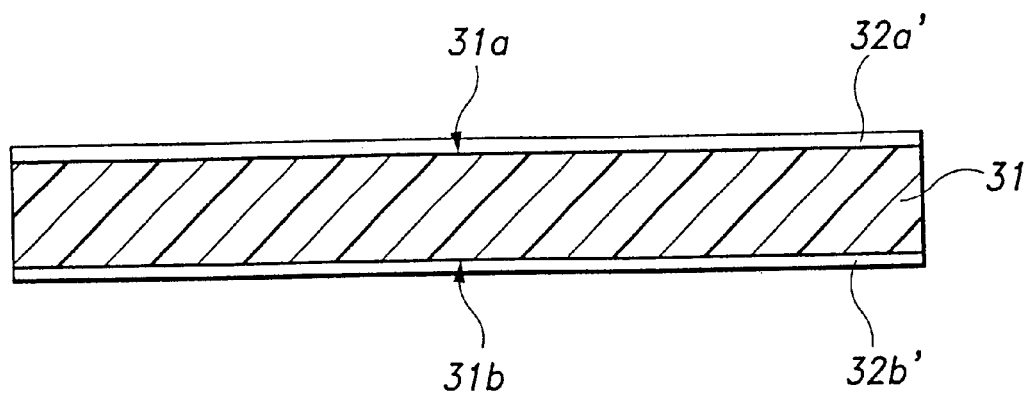
FIGS. 4A, 4B, 4C, 4D, 4E, and 4F are cross-sectional views illustrating the manufacturing steps for the semiconductor device package according to the first embodiment of the present invention.
Figure 4B:
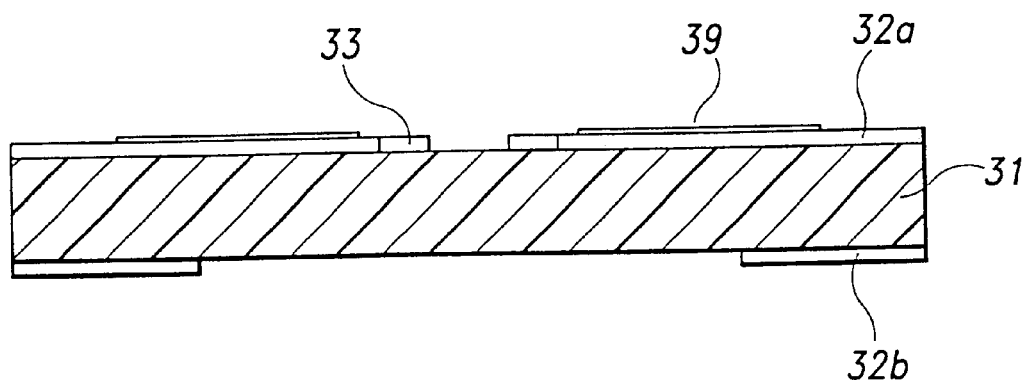

With reference to FIG. 4A and FIG. 4B, electrical conductive layers 32a', 32b' are laminated on the upper 31 a and the lower surfaces 31b of the circuit board 31. The electrical conductive layers 32a', 32b' comprise, for example, a gold layer that is plated on an upper surface of a copper layer. The electrical conductive layers 32a', 32b' are etched and metal patterns 32a, 32b as shown in FIG. 4B are formed. Passivation layers 39 are formed on upper surfaces of the metal patterns 32a by applying a solder resist so as to protect the metal patterns 32a which are formed on the upper surface 31a of the circuit board 31. The metal patterns 32a have connection pads 33, which extend from the metal patterns 32a, to provide higher quality and more stable wire-bonding.

Figure 4C:
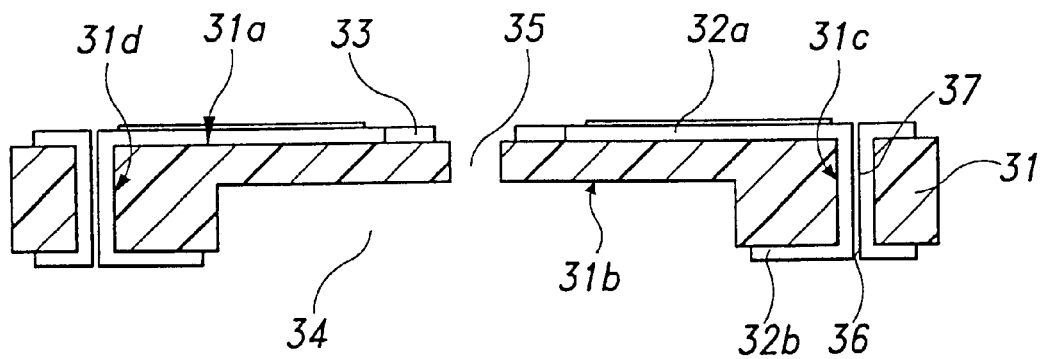

In FIG. 4C, a cavity 34 is then formed in the lower surface 31b of the circuit board 31 and an opening 35 is formed through the upper surface 31a, which passes through the circuit board 31. The respective sizes of the cavity 34 and the opening 35 depend on the size of the semiconductor chip 40. Through holes 36 are formed on both sides 31c, 31d of the circuit board 31 by drilling. Inner walls of the through holes 36 are plated with a conductive material so that the metal patterns 32a on the upper surface 31a of the circuit board 31 can be electrically interconnected to the metal patterns 32b on the lower surface 31b. Preferably, the metal patterns 32a, 32b of the upper and the lower surfaces of the circuit board 31 are formed so that the metal patterns 32a, 32b are disposed at the same vertical position such that the through holes 36 pass through both the metal patterns 32a, 32b by drilling. The metal patterns 32a are electrically interconnected to the metal patterns 32b by the plating layers 37 on the inner walls of the through holes 36.

If the metal patterns 32a, 32b are designed not to be vertically aligned, the plating layers 37 on the inner walls of the through holes 36 can be formed so that the plated portions of the inner walls of the through holes 36 connect to the metal patterns 32a, 32b.

The order of performing the steps of forming the cavity 34 and the opening 35, and the step of forming the plating layers 37 is not significant. That is, the step of forming the cavity 34 and the opening 35 can precede or follow the step of forming the plating layers 37 on the inner wall of the through holes 36.

Figure 4D:
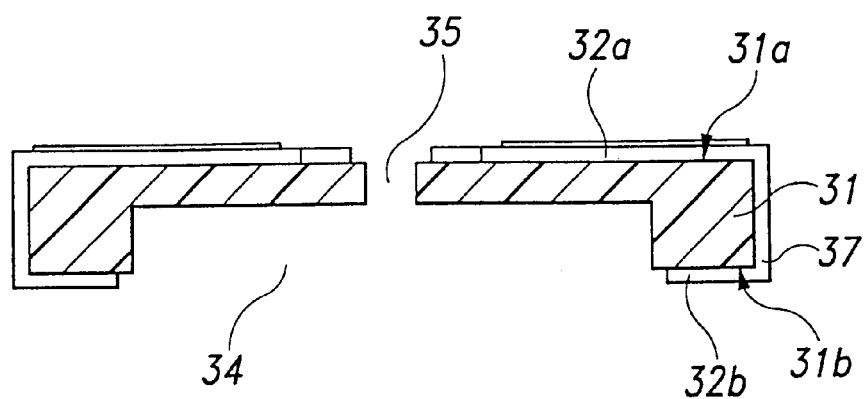
Figure 4E:
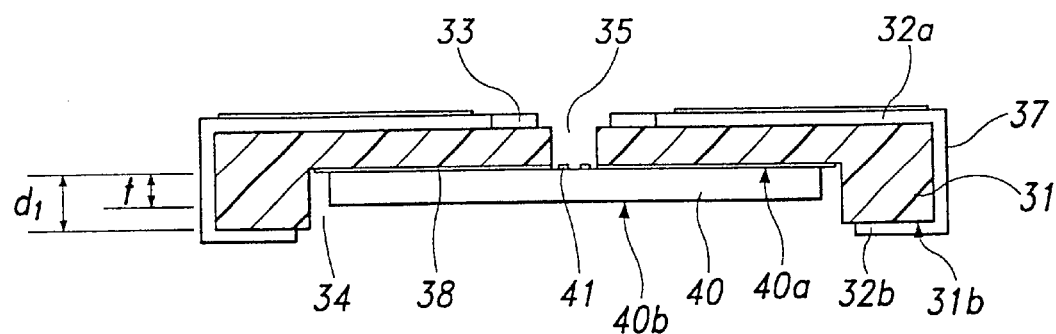

Then circuit board 31 is then cut by punching the through holes 36 so that the plating layers 37 for electrically connecting the metal patterns 32a, 32b are maintained as shown in FIG. 4D. The circuit board 31 may be vertically cut by a punching method with mechanical pressure, and the edge portions of the circuit board 31 are removed. to As shown in FIG. 4E, the semiconductor chip 40 is attached to the circuit board 31 with an adhesive 38 so that bonding pads 41 are exposed through the opening 35. Because an active surface 40a of the chip 40 is attached to the circuit board 31, it is preferable to use an insulating adhesive 38 so as to protect the ICs on the active surface 40a. As shown, the semiconductor chip 40 is disposed entirely within cavity 34 in circuit board 31. The lower surface 40b of the semiconductor chip 40 is higher than lowest portion of the lower surface 31b of the circuit board 31, since the depth 'd$_1$' of the cavity 34 is greater than the thickness 't' of the semiconductor chip 40.

Figure 4F:
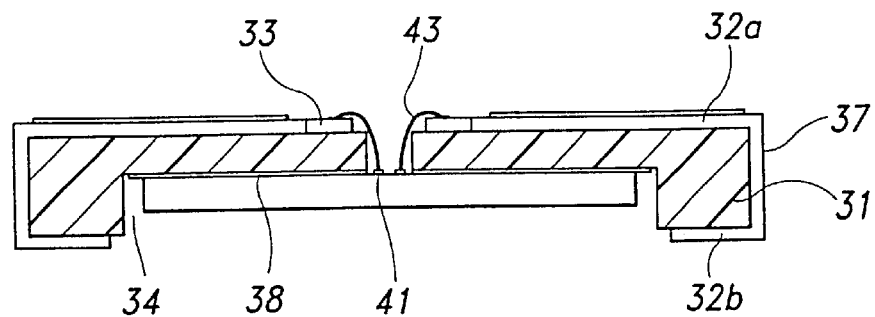

As shown in FIG. 4F, after attaching the semiconductor chip 40, the metal patterns 32a are electrically interconnected to the bonding pads 41 via conductive metal wires 43 through connection pads 33, which are formed on inner terminals of the metal patterns 32a. The connection pads 33 provide a more stable interconnection between the metal patterns 32a and the bonding pads 41.

After completing the wire-bonding, the electrical interconnection parts between the chip 40 and circuit board 31 are encapsulated with an EMC 44 and the semiconductor device package 30 as shown in FIG. 3 is completed. The opening 35 is filled with the EMC 44 by a transfer molding method or a potting method. The electrical interconnection parts, including the active surface 40a of the chip 40 and the bonding wires 43 are encapsulated in order to protect them from the external environment.

Because the above-described method of manufacturing a semiconductor device package uses the metal patterns 32b at the lower surface 31b of the circuit board 31 as the external connection means, the step of attaching a separate external connection means to the circuit board 31 is eliminated. Therefore the present manufacturing method can be carried out using conventional equipment, and does not require additional special equipment.

Although the circuit board of the above-described embodiment shows the mounting of one chip to a single circuit board, a series of the circuit boards which are divided into a plurality of individual circuit board units can also be used.

Figure 5:
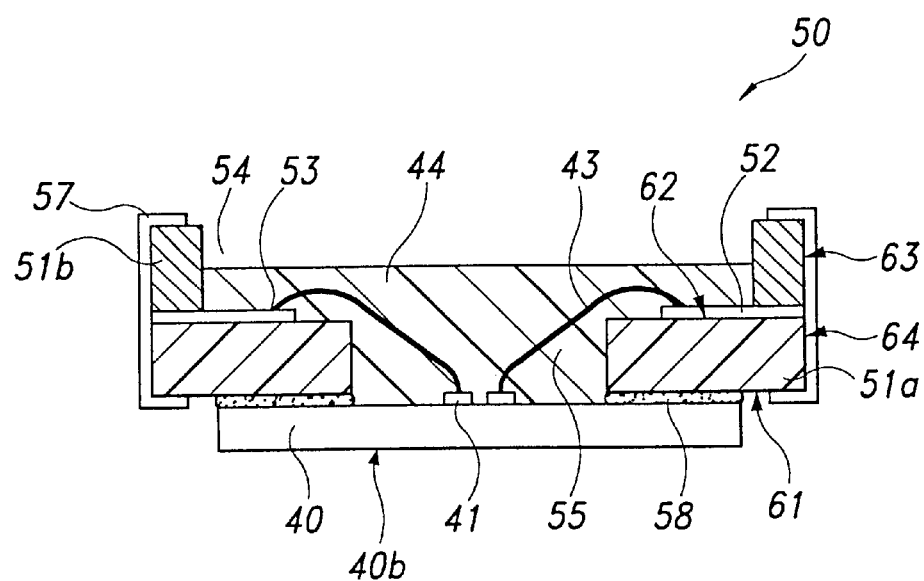
FIG. 5 is a cross-sectional view depicting a semiconductor device package according to a second embodiment of the present invention.

FIG. 5 is a cross-sectional view depicting a semiconductor device package according to a second embodiment of the present invention, in which a second circuit board 51b is arranged on an upper surface 62 of a first circuit board 51a and the semiconductor chip 50 is attached to a lower surface 61 of the first circuit board 51a.

Metal patterns 52 are formed between the first circuit board 51a and the second circuit board 51b, and are connected to plating layers 57 on side walls 64, 63 of the first and the second circuit boards 51a, 51b. An opening 55 and a cavity 54 are formed on the first circuit board 51a and the second circuit board 51b, respectively, and the semiconductor chip 40, having center bonding pads 41, is attached to the lower surface 61 of the first circuit board 51a with an adhesive 58. The bonding pads 41 of the chip 40 that are exposed through the cavity 54 are electrically interconnected to the connection pads 53 with conductive wires 43. The cavity 54 of the first circuit board 51a and the opening 55 of the second circuit board 51b are filled with the EMC 44. The lower surface 40b of the chip 40 is exposed to the outside in order to dissipate the heat from the chip 40. When the semiconductor device package 50 is mounted on the external apparatus, the lower surface 40b of the package 50 is attached to the upper surface of the external apparatus.

FIGS. 6A through FIG. 6F are cross-sectional views illustrating the manufacturing steps of the semiconductor device package according to the second embodiment of the present invention.

Figure 6A:
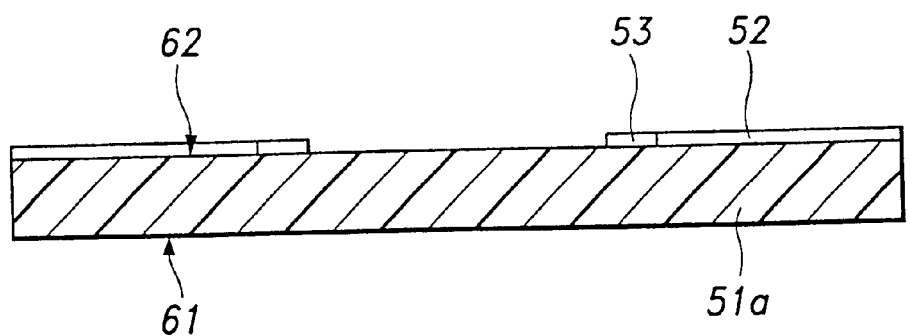
FIGS. 6A, 6B, 6C, 6D, 6E, and 6F are cross-sectional views illustrating the manufacturing steps for the semiconductor device package according to the second embodiment of the present invention.

Referring to FIG. 6A, after preparing the first circuit board 51a having constant width and depth, the metal patterns 52 are formed on the upper surface 62 of the first circuit board 51a. Inner regions of the metal patterns 52 act as connection pads 53.

Figure 6B:
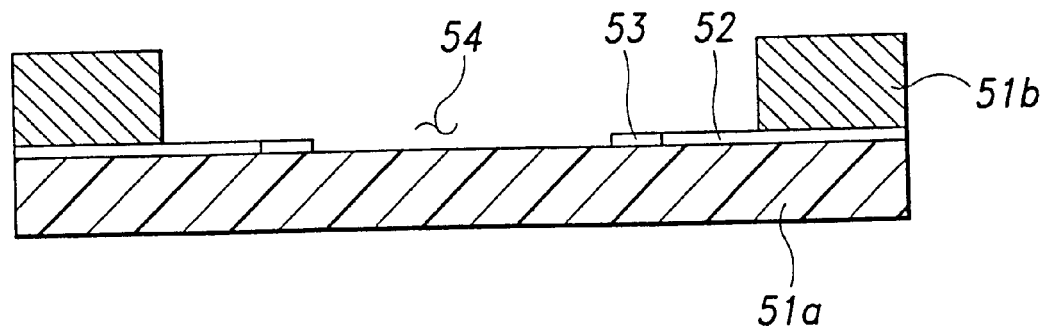
Figure 6C:
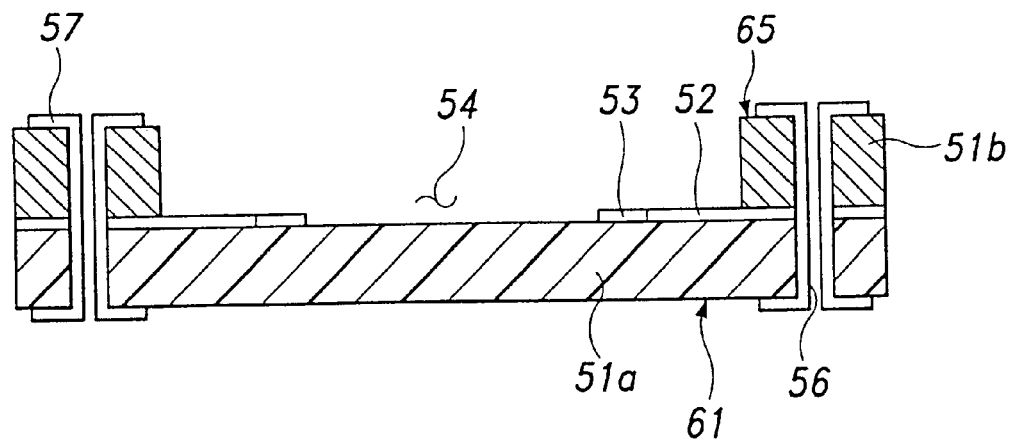

Then, a second circuit board 51b is attached to the upper surface of the metal patterns 52 as shown in FIG. 6B. The cavity 54 that is formed passes through the second circuit board 51b and is large enough to partially expose the metal patterns 52 of the first circuit board 51a. After attaching the second circuit board 51b to the first circuit board 51a, through holes 56 are formed on both sides of the first and the second circuit boards 51a, 51b as shown in FIG. 6C. Inner walls of the through holes 56, the lower surface 61 of the first circuit board 51a, and the upper surface 65 of the second circuit board 51b are plated with a conductive metal such as Cu, or Au to thereby form plating layers 57. The plating layers 57 are electrically connected to the metal patterns 52.

Figure 6D:
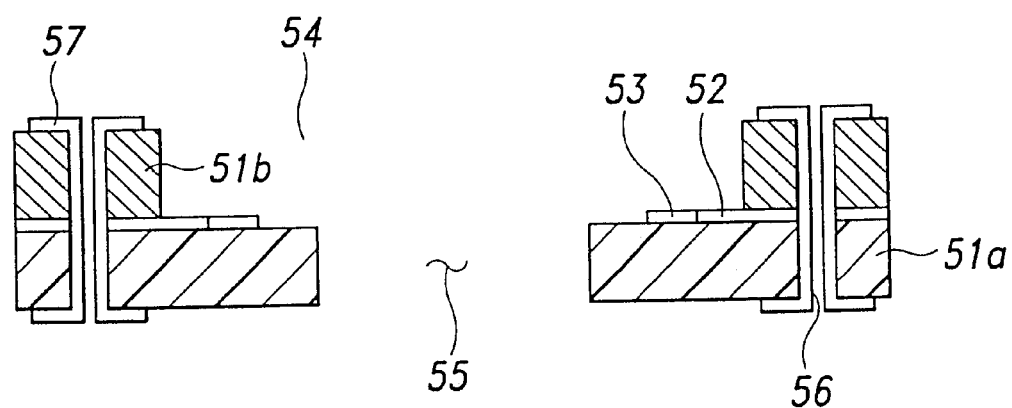

After forming the plating layers 57, the opening 55 is formed through the first circuit board 51a as shown in FIG. 6D. The size of the opening 55 depends on the size of the semiconductor chip 40.

Figure 6E:
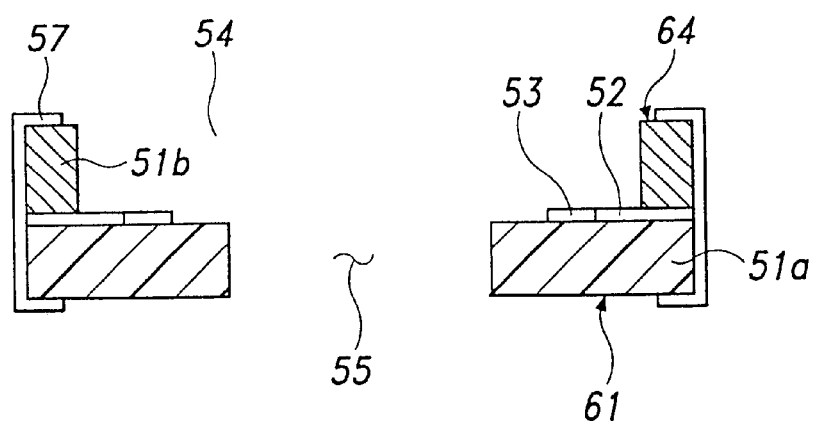

The first circuit board 51a and the second circuit board 51b are vertically cut by punching the through holes 56 as shown in FIG. 6E. Even after completing the cutting, the plating layers 57 are maintained on the inner walls of the through holes 56, the lower surface 61 of the first circuit boards 51a and the upper surface 65 of the second circuit board 51b.

Figure 6F:
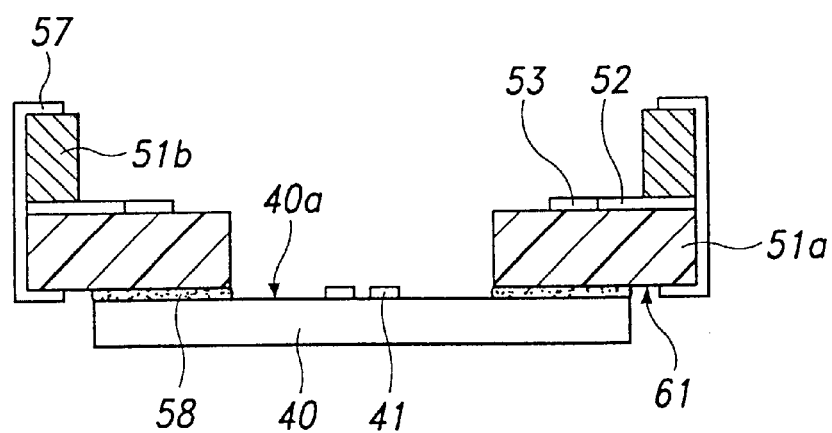

As shown in FIG. 6F, the semiconductor chip 40 is mounted on the lower surface 61 of the first circuit board 51a. That is, an active surface 40a of the chip 40 where the bonding pads 41 are formed is attached to the lower surface 61 of the first circuit board 51a by the adhesive 58. After mounting the semiconductor chip 40, the bonding pads of the chip 40 are electrically interconnected to the connection pads 53 by wires 43 (see FIG. 5). The electrical interconnection parts are encapsulated with the EMC 44. The semiconductor chip 40 is thus electrically connected to the plating layers 57, which are used as the external connection means, through the metal patterns 52.

Figure 7:
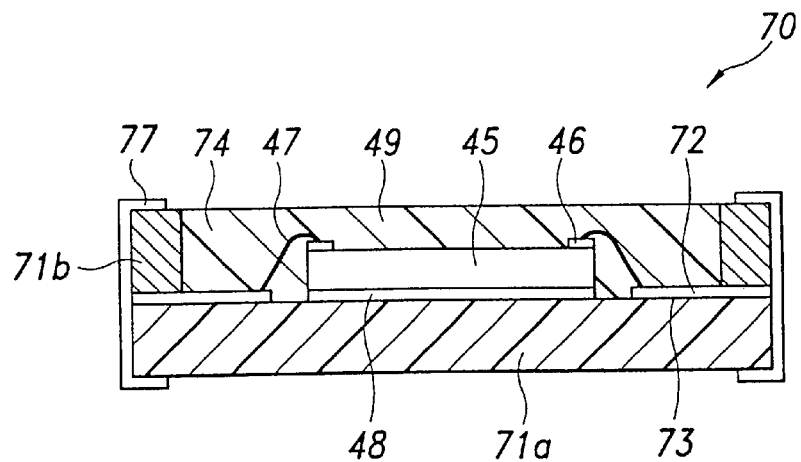
FIG. 7 is a cross-sectional view depicting a semiconductor device package according to a third embodiment of the present invention.

FIG. 7 is a cross sectional view for depicting a semiconductor device package 70 according to a third embodiment of the present invention.

Referring to FIG. 7, a semiconductor chip 45 having edge bonding pads 46 is mounted on the first circuit board 71a by an adhesive 48 and disposed within a cavity 74 of the second circuit board 71b. The metal patterns 72 which are formed between the first circuit board 71a and the second circuit board 71b are electrically interconnected to the bonding pads 46 by conductive metal wires 47 and are further connected to the plating layers 77, which are used as the external connection means. The electrical interconnection parts of the semiconductor device package 70 are encapsulated with the EMC 49.

The semiconductor device package embodiments of the present invention have structures which allow for easy production of stack packages.

Figure 8:
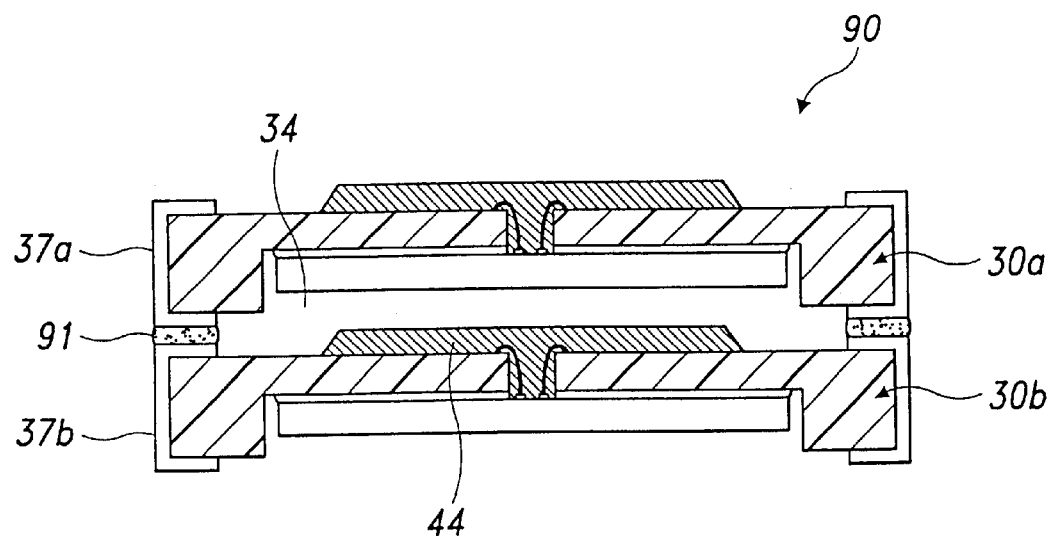
FIG. 8 is a cross-sectional view depicting a stack package using semiconductor device packages of the first embodiment of the present invention.

FIG. 8 is a cross-sectional view depicting a stack package using semiconductor device packages according to the first embodiment of the present invention.

Referring to FIG. 8, a stack package 90 comprises individual semiconductor device packages 30a, 30b, having the structure as shown in FIG. 2 and FIG. 3, which are vertically stacked and fixed by solder 91 between the plating layers 37a, 37b. Because the hardened EMC 44 of the lower semiconductor device package 30b is disposed inside the cavity 34 of the upper semiconductor device package 30a, the height of the stack package 90 is not increased. Because the stack package 90 is formed by the stacking of the individual semiconductor device packages 30a, 30b which have short electrical paths, it has an advantage in that the operational speed of the signal is increased as compared to other packages.

Also, it has excellent stacking and mounting characteristics. The lowermost semiconductor device package 30b would be connected to an external apparatus via the plating layer 37b. By using the plating layer 37b as the external connection means, the step of attaching a separate external connection means to interface with the external device is eliminated.

Further, the overall stack thickness is reduced compared to other stack packages, because each of the plurality of packages in the stack is thinner as well. The stack package 90 is formed by applying solder 91 on the plating layers 37a, 37b of the semiconductor device package 30a, 30b and bonding the plating layers 37a, 37b by a reflowing method, after completing the forming of the individual semiconductor device packages 30a, 30b.

Figure 9:
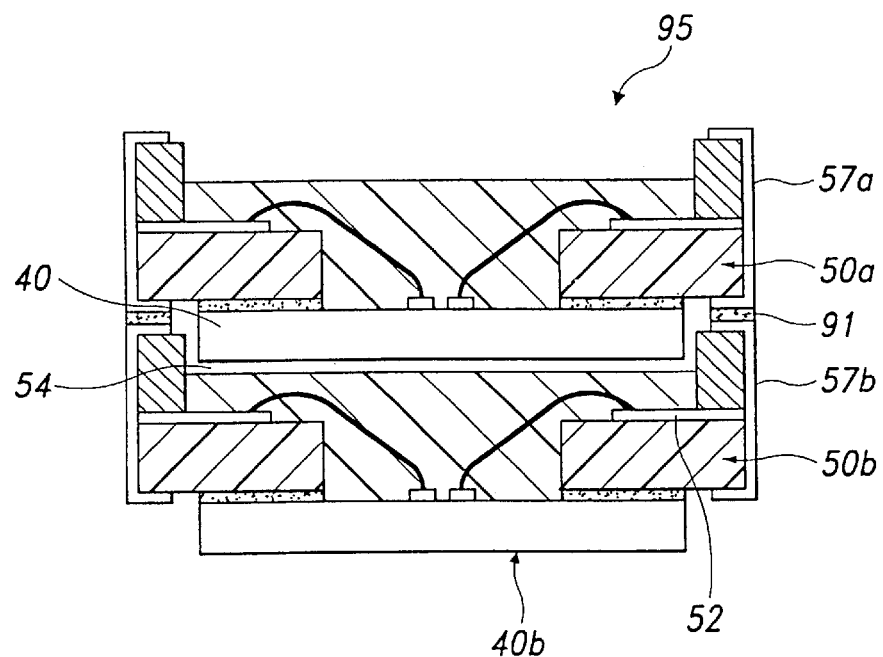
FIG. 9 is a cross-sectional view depicting a stack package using semiconductor device packages of the second embodiment of the present invention.

Referring to FIG. 9, a stack package 95 comprises individual semiconductor device packages 50a, 50b, having the structure as shown in FIG. 5, which are vertically stacked and fixed by solder 91 between the plating layers 57a, 57b. Because the semiconductor chip 40 of the upper semiconductor device package 50a is disposed inside the cavity 54 of the lower semiconductor device package 50b, the height of the stack package 95 is not increased. Because the stack package 95 is formed by the stacking of the individual semiconductor device packages 50a, 50b which have short electrical paths, it has an advantage in that the operational speed of the signal is increased as compared to other packages.

Also, it has excellent stacking and mounting characteristics. The lowermost semiconductor device package 50b would be connected to an external apparatus via the lower surface 40b of the semiconductor chip 40 of the lowermost semiconductor package device 50b. By using the lower surface 40b of the semiconductor chip 40 as the external connection means, the step of attaching a separate external connection means to interface with the external device is eliminated.

Further, the overall stack thickness is reduced compared to other stack packages, because each of the plurality of packages in the stack is thinner as well. The stack package 95 is formed by applying solder 91 on the plating layers 57a, 57b of the semiconductor device package 50a, 50b and bonding the plating layers 57a, 57b by a reflowing method, after completing the forming of the individual semiconductor device packages 50a, 50b.

Figure 10:
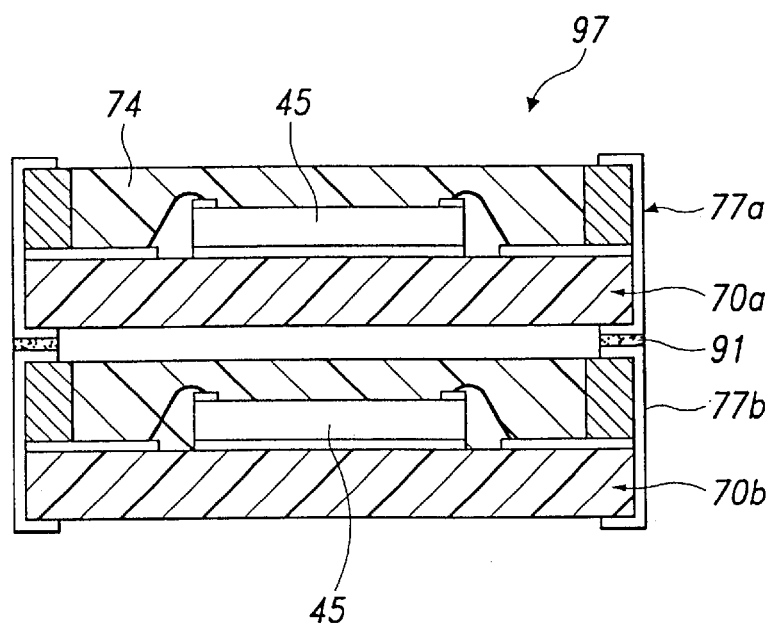
FIG. 10 is a cross-sectional view depicting a stack package using semiconductor device packages of the third embodiment of the present invention.

Referring to FIG. 10, a stack package 97 comprises individual semiconductor device packages 70a, 70b, having the structure as shown in FIG. 7, which are vertically stacked and fixed by solder 91 between the plating layers 77a, 77b. Because the semiconductor chip 45 is disposed inside the cavity 74 of the second circuit board 71b (see FIG. 7), the height of the stack package 97 is not increased. Because the stack package 97 is formed by the stacking of the individual semiconductor device packages 70a, 70b which have short electrical paths, it has an advantage in that the operational speed of the signal is increased as compared to other packages.

Also, it has excellent stacking and mounting characteristics. The lowermost semiconductor device package 70b would be connected to an external apparatus via the plating layer 77b. By using the plating layer 77b as the external connection means, the step of attaching a separate external connection means to interface with the external device is eliminated.

Further, the overall stack thickness is reduced compared to other stack packages, because each of the plurality of packages in the stack is thinner as well. The stack package 97 is formed by applying solder 91 on the plating layers 77a, 77b of the semiconductor device package 70a, 70b and bonding the plating layers 77a, 77b by a reflowing method, after completing the forming of the individual semiconductor device packages 70a, 70b.

According to the present invention, the semiconductor device packages and the stack packages using the same have unique advantages in that they can be effectively employed in smaller and thinner electronic apparatus. Also, the operational speed of the semiconductor chip increases due to the short distance from the semiconductor chip to the metal patterns of the lower surface of the circuit board, which are used as an external connection means.

Further, the method for manufacturing the semiconductor device package eliminates the step of attaching separate external connection means, because the metal patterns of the circuit board, or the lower surface of the chip, are used as the external connection means. Therefore, time and cost for manufacturing the external connection means is eliminated.

Although preferred embodiments of the present invention have been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A semiconductor device package, comprising:

first circuit board having conductive metal patterns formed on an upper surface of the first circuit board and an opening centrally formed through the first circuit board;

a second circuit board formed on the metal patterns, the second circuit board having a cavity centrally formed therein;

a semiconductor chip attached to a lower surface of the first circuit board by an adhesive so that bonding pads of the chip are exposed through the opening; and plating layers formed in contact with side surfaces of the first circuit board and second circuit board, which are electrically interconnected to the metal patterns between the first circuit board and the second circuit board.

2. The semiconductor device package of claim 1, wherein portions of the metal patterns are partially exposed in the cavity of the second circuit board and the exposed portions of the metal patterns are electrically interconnected to the bonding pads with bonding wires.

3. The semiconductor device package of claim 2, wherein the electrical interconnection parts include the exposed portions of the metal patterns, which are encapsulated with an epoxy molding compound.

4. The semiconductor device package of claim 1, wherein the plating layers cover an edge portion of an upper surface of the second circuit board, extend along said side surfaces of the first circuit board and the second circuit board, and cover an edge portion of the lower surface of the first circuit board, with the metal patterns being electrically interconnected to the plating layers.

5. A stack package having a plurality of vertically stacked semiconductor device packages, each of said semiconductor device packages comprising:

a first circuit board having conductive metal patterns formed on an upper surface of the first circuit board and an opening centrally formed through the first circuit board;

a second circuit board formed on the metal patterns, the second circuit board having a cavity centrally formed therein;

a semiconductor chip attached to a lower surface of the first circuit board by an adhesive so that bonding pads of the chip are exposed through the opening; and plating layers formed in contact with side surfaces of the first circuit board and second circuit board, wherein the plating layers cover an edge portion of an upper surface of the second circuit board, extend along said side surfaces of the first circuit board and the second circuit board, and cover an edge portion of the lower surface of the first circuit board, with the metal patterns being electrically interconnected to the plating layers between the first circuit board and the second circuit board, wherein electrical connection between an upper semiconductor device package and a lower semiconductor device package, of the plurality of semiconductor packages, is accomplished by bonding the plating layer of the edge portion of the lower surface of the first circuit board of the upper semiconductor device package and the plating layer of the edge portion of the upper surface of the second circuit board of the lower semiconductor device package with a conductive adhesive, and wherein a lowermost semiconductor device package of the plurality of semiconductor packages is electrically connected to an external apparatus via a lower surface of the semiconductor chip of the lowermost semiconductor device package.

* * * * *